United States Patent [19]

Ward, Jr.

[11] 4,277,763
[45] Jul. 7, 1981

[54] NON-LINEAR PREDISTORTION LINEARIZING CIRCUIT FOR A VARACTOR DIODE TUNED OSCILLATOR

[76] Inventor: William H. Ward, Jr., 1561 Mesa Dr., Costa Mesa, Calif. 92626

[21] Appl. No.: 967,882

[22] Filed: Dec. 8, 1978

Related U.S. Application Data

[62] Division of Ser. No. 879,464, Feb. 21, 1978.

[51] Int. Cl.³ .............................................. H03C 3/22
[52] U.S. Cl. ................................. 331/96; 331/107 G; 331/177 V; 332/30 V
[58] Field of Search ............... 331/96, 107 DP, 107 G, 331/177 V, 178, 4; 333/231; 328/184; 332/30 V

[56] References Cited

U.S. PATENT DOCUMENTS

| | | | |
|---|---|---|---|
| 3,728,579 | 4/1973 | Rogowski | 328/184 X |
| 3,747,023 | 7/1973 | Hoft et al. | 331/177 V X |
| 3,872,406 | 3/1975 | Grafinger | 331/178 |
| 3,982,211 | 9/1976 | Endersz | 331/177 V X |
| 4,003,004 | 1/1977 | Fletcher et al. | 332/30 V |
| 4,140,981 | 2/1979 | Bergman | 331/177 V X |

Primary Examiner—Siegfried H. Grimm
Assistant Examiner—Edward P. Westin
Attorney, Agent, or Firm—Jackson, Jones & Price

[57] ABSTRACT

A hand held, short range FM radar device is provided employing a unique tracking circuit and a predistortion circuit to linearize the sweep function to a Gunn oscillator which produces the rf signal. A parabolic generator comprising a linear operational amplifier and passive elements connected thereto is used to shape the saw tooth sweep signal to the Gunn oscillator.

The output is directly read out on an LED display; an audio signal is also produced whose frequency is a function of target distance.

4 Claims, 5 Drawing Figures

NON-LINEAR PREDISTORTION LINEARIZING CIRCUIT FOR A VARACTOR DIODE TUNED OSCILLATOR

This application is a division of Ser. No. 879,464, Feb. 21, 1978.

BACKGROUND OF THE INVENTION

This invention relates to a short range, hand held, FM radar device having a unique tracking operation and a linearizing sweep for a varactor drive to a Gunn diode which generates the rf signal. The target signal is read as distance on an LED display; an audio output simultaneously produces a frequency tone proportional to target distance.

The tracking circuit which is employed by the invention also can be utilized for other purposes besides radar. This includes radio receivers, hum rejection, morse code reception, speech recognition, S/N improvement of electrocardiogram signals, lock-in amplifiers, discriminators, frequency synthesizers, etc., where it is desired to improve the S/N of a slowly moving signal.

Many needs exist for a short range radar device that is both inexpensive and lightweight. As an example, small craft such as sailboats and small powerboats could use such a radar device since these craft cannot justify the size, weight and expense of a more conventional radar system. Although effective only at short range, a lightweight, short range radar device would be highly desireable since a slowly moving craft could easily avoid a collision or an obstacle if the operator were to have sufficient warning. Even a large craft could employ a short range, portable radar; if it were moored or drifting, detection of an oncoming craft would enable the operator to adopt collision avoidance procedures.

Furthermore, if a radar device were portable, it could be utilized by the owner at various locations rather than having it confined to a fixed installation. This flexibility would increase the value of the device since it could be rented and therefore be used very frequently.

Many radar devices employ a klystron tube for the rf oscillator, and this represents an expensive component of the system; replacement of this tube by, say, an rf Gunn oscillator and tuning diode would considerably reduce the overall cost of the radar device. However, for FM modulation, it is preferable to employ a suitable wave form to the tuning diode to obtain a target signal that is linear with respect to distance.

Finally, it is important that a suitable target discriminator system is utilized which is inexpensive, effective, and can provide a fast response time for adequate signal discrimination.

THE INVENTION

According to the invention, a short range, lightweight (about 3 pounds) portable radar device is provided employing a unique tracking filter, a Gunn rf oscillator in a microwave cavity, a varactor diode to sweep (or tune) the cavity, and a predistortion circuit to linearize the rate of change of frequency. The sweep signal to the varactor diode is produced by a saw tooth generator and predistorted in a parabolic generator. Consequently, a difference frequency is subsequently produced which is linear and can be converted readily into target distance.

Basically, the tracking filter feeds signals from high and low pass outputs from a filter section to an error drive circuit. An addition and a multiplication are performed in the error drive circuit to produce the function: High Pass (High Pass + Low Pass)Voltage, which is abbreviated: $High_{p.v.}(High_{p.v.} + Low_{p.v.})$. This function is then integrated to produce the error drive signal: $\int High_{p.v.}(High_{p.v.} + Low_{p.v.})dt$, which is then fed back to the filter section. The error drive signal then operates to center and lock the band pass output on the primary or predominant input (i.e. target) frequency.

DESCRIPTION OF THE PREFERRED EMBODIMENT

Figure 1:
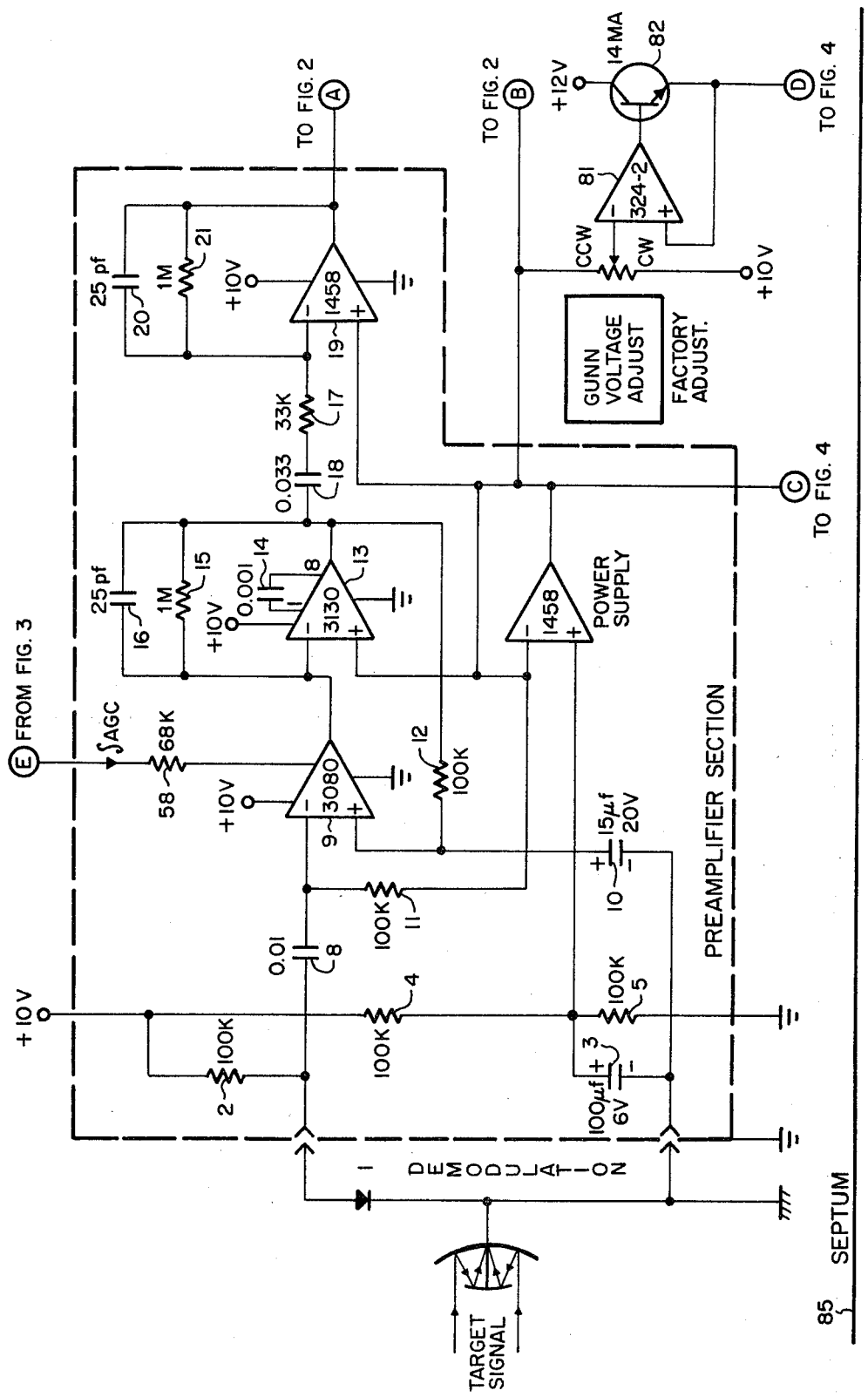
FIGS. 1–5 illustrate a preferred circuit diagram of the FM radar device of this invention.
Figure 2:
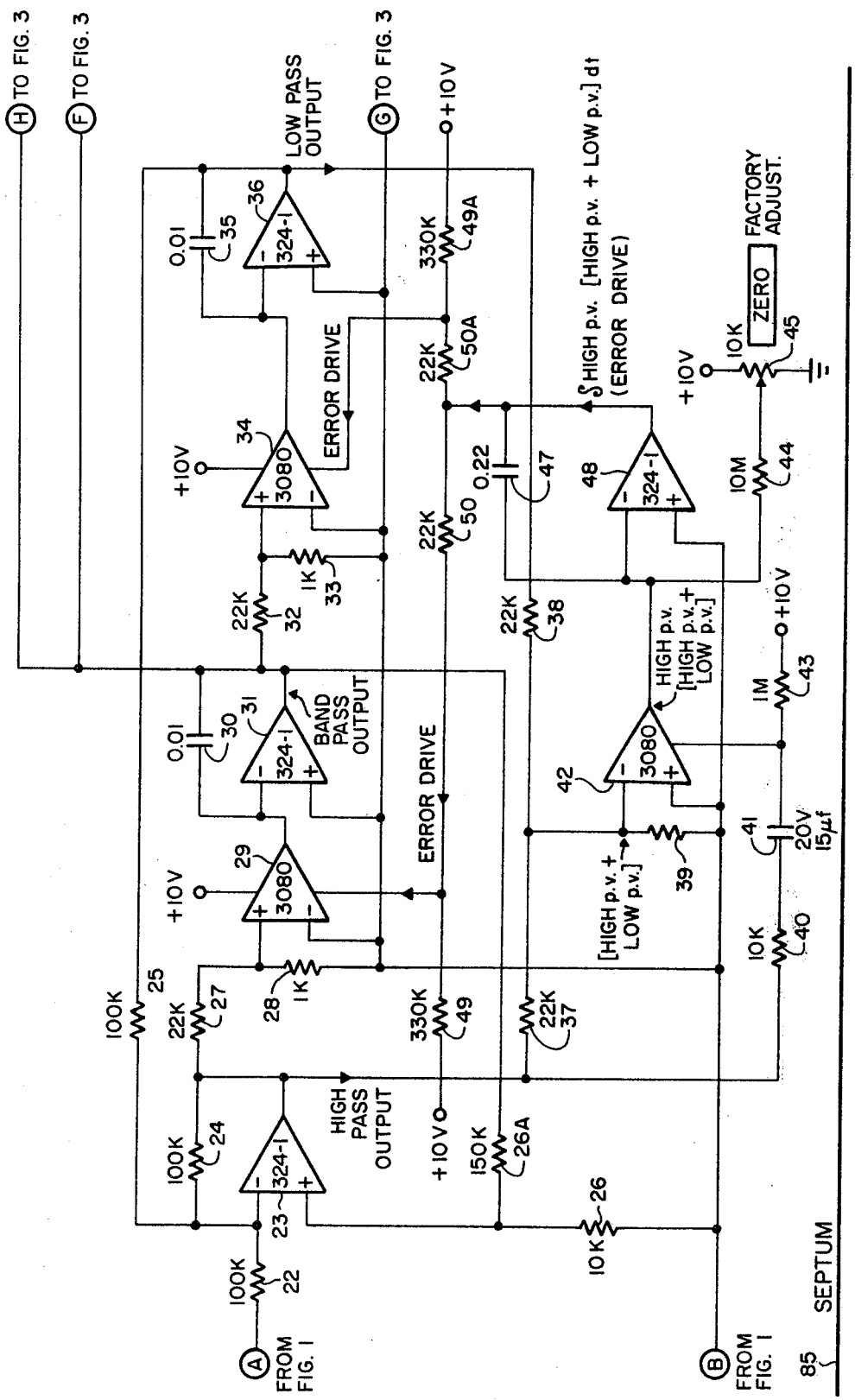

The circuit elements shown in the drawings are discrete elements but these can, of course, be incorporated into a chip circuit if justified by the economics of quantity production.

Referring to the circuit, incoming signals from the target are fed to a diode mixer 1 which produces a difference signal that is fed to a preamplifier section having a wide (60 db.) AGC range. Power for the preamplifier is supplied through a bias resistor 2 and through a voltage divider comprising a capacitor 3 and resistors 4 and 5. The difference frequency is fed through a coupling capacitor 8 to a variable, transconductance amplifier 9 which is a variable gain amplifier (i.e. multiplier); no signal feedback is desired. Self biasing and dc feedback from a subsequent stage is obtained for the amplifier 9 by a capacitor 10 and resistances 11 and 12. The difference signal is fed to an impedance matcher 13 supplied with a band width control capacitor 14; feedback to the input of the impedance matcher 13 is through a resistor 15 and low pass capacitor 16. As mentioned, dc biasing feedback to the transconductance amplifier 9 is through the resistor 12. The difference signal is fed through an RC circuit 17, 18 (which functions as a time constant and coupling circuit) to a gain stage 19. Feedback to the gain stage 19 is made, as in the case of impedance matcher 13, through a 25 pf capacitor 20 and resistor 21.

In the filter section, amplifier 23 sums the input signal from resistor 22, the low pass signal through resistance 25, and the high pass output through resistance 24, the sum being the high pass output. The non inverting input of amplifier 23 is driven by a band pass output (infra) through a voltage divider 26, 26A; this sets the Q of the filter, and thus the band width.

The high pass output is fed to a variable gain element consisting of a voltage divider having resistances 27, 28 and a variable operational transconductance amplifier (OTA) 29. The current from OTA 29 is integrated in capacitor 30 by an amplifier 31; this provides the band pass output.

The bandpass signal is fed to an OTA stage comprising resistors 32, 33, OTA 34, amplifier 36 and capacitor 35 which operates in the same manner to provide a low pass output. The gains of the OTAS are determined by the bias current provided to them through resistors 49, 49A, 50 and 50A. The voltage at the junction of resistances 50 and 50A will therefore determine the center frequency of the filter.

Figure 3:
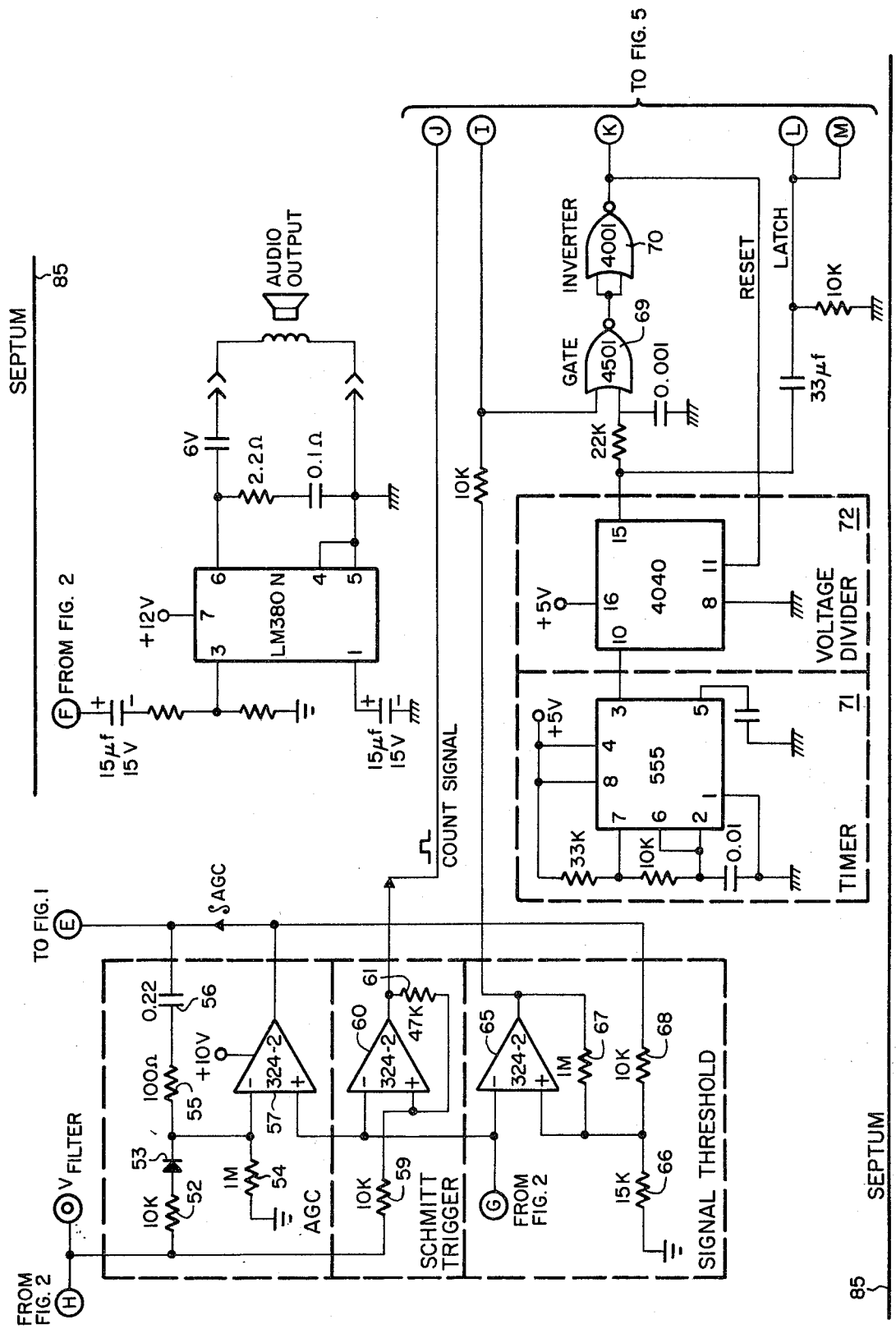

The bandpass output representing the target signal in which random noise, clutter, interference, etc., has been reduced is then fed to a conventional audio amplifier output, shown in FIG. 3. Variations in audio frequency as a function of target distance enable the user, with practice, to employ the auido portion to supplement use of an LED readout which will be described, infra. The operating technique is quite simple since, usually, it merely entails searching for a target; during the target searching phase, the audio produces a varying sound until the target is located. The varying sound then becomes a continuous tone indicating the signal has locked onto a valid target; the target distance is then read from the LED. A compass (not shown) may be mounted on the device to facilitate avoidance procedures when a target is located. The bandpass output also is fed through an AGC feedback circuit which will be discussed, infra.

High pass signals from the amplifier 23 and low pass signals from the amplifier 36 are fed to an error drive network to obtain the error drive signal: $\int High_{p.v.}\cdot(High_{p.v.}+Low_{p.v.})dt$. The output signals are first summed across resistors 37, 38 which sum the voltages to obtain the function: (High pass output voltage+Low pass output voltage), and this sum is then fed to a multiplier 42. The high pass signal also is fed from amplifier 23 through a summing resistor 40 and coupling capacitor 41 to the multiplier 42; this obtains the function: $High_{p.v.}(High_{p.v.}+Low_{p.v.})$ at the output of the multiplier 42. A voltage divider 39 produces a 20:1 voltage ratio for the input voltage range of the multiplier 42, while a bias resistor 43 sets the quiescent current for the multiplier from an analogue power supply. Resistances 44, 45 are used to produce a zero adjustment for offset current.

The current representing the function: $High_{p.v.}\cdot(High_{p.v.}+Low_{p.v.})$ is then integrated in capacitor 47, and integrating amplifier 48 to obtain the integrated function: $\int High_{p.v.}(High_{p.v.}+Low_{p.v.})\,dt$, which is the error drive signal. Bias current for the amplifiers 29, 34 is supplied through bias resistors 49, 49A. Resistors 50, 50A convert the center frequency voltage (i.e. error drive voltage) to a center frequency error drive current. The error drive changes the effective resistance of the amplifiers 29, 34 causing the filter center frequency voltage to be modified and thereby centering the bandpass output on the predominant target frequency.

The tracking operation is as follows: random noise which is received will produce no dc. component in the error signal integrator; hence, the center frequency of the filter remains constant. When a target is located, it will produce repetitive signals, and the multiplier (and hence integrated signal) will produce a dc component. When applied to the voltage variable networks, the center frequency of the filter will be driven toward the frequency of the repetitive signal, which is the target. As the center frequency of the filter approaches the target frequency, the center frequency will be amplified even more and center and lock the filter onto the target frequency. If the signal frequency then changes slightly, the integrated error drive signal forces the filter to follow because changes in signal frequency will produce an immediate change in the integrated signal. In effect, the tracking filter selects the signal having the strongest Fourier component of the signal, locks onto the frequency and rejects other lower amplitude frequencies. The signal from the bandpass output is fed to the audio output which produces a continuous audio tone, the frequency of which is proportional to target distance.

AGC is obtained by comparing the bandpass output with a reference, integrating the difference and feeding the integrated difference back to the preamplifier stage. The AGC network is fed from the bandpass output of the filter and comprises a resistance 52 and diode 53 which rectify the output voltage, a resistance 54 to set up a reference current and an integrator comprising a resistance 55, capacitor 56 and amplifier 57. An integrating feedback is employed to slow the response time so that the AGC will follow the input signal amplitude (i.e. the envelope), but will not follow the input signal itself. AGC feedback resistor 58 converts the AGC voltage to a bias current for OTA 9.

Repetitive output (i.e. target) signals from the bandpass output of the filter section are sent through an input resistor 59 to a square wave forming Schmitt trigger circuit 60 and 61, where each output signal is converted to a square wave pulse. Resistance 61 is employed to provide hysterisis for the circuit and this enables its response to be set for a specific minimum height and thus act as a discriminator. Since the output frequency from the filter is linear with respect to distance, a count/unit time=frequency can be translated into target distance; this count is then sent to a 4 decade counter 62 and through drivers 63 for display in an LED 64.

The AGC signal is also sent to a signal threshold circuit 65, 66, 67 and 68. An excessive AGC signal indicating an invalid (i.e. low amplitude) signal, will shut off the LED drivers 63 and hold the counters at zero by means of a gate. Consequently, the signal threshold circuit and filter function together to permit in the LED display, only repetitive signals, and only those repetitive signals which exceed a specific minimum strength.

A level indicating a valid target is fed through a gate 69 and inverter 70 which enables a latch signal and activates the LED drivers 63. The latch signal is then fed to the counter, and when combined with the count signal, will be registered as target distance.

Timing signals for the LED are produced by a timer 71 with 1 KHz oscillations which are converted to about 1 second square wave pulses in a voltage divider 72. A latch signal and reset signal are derived from the square wave and used to transfer counter information into the display latch and reset the counters respectively every second. An invalid signal from the signal threshold circuit disables and resets the counter.

Figure 4:
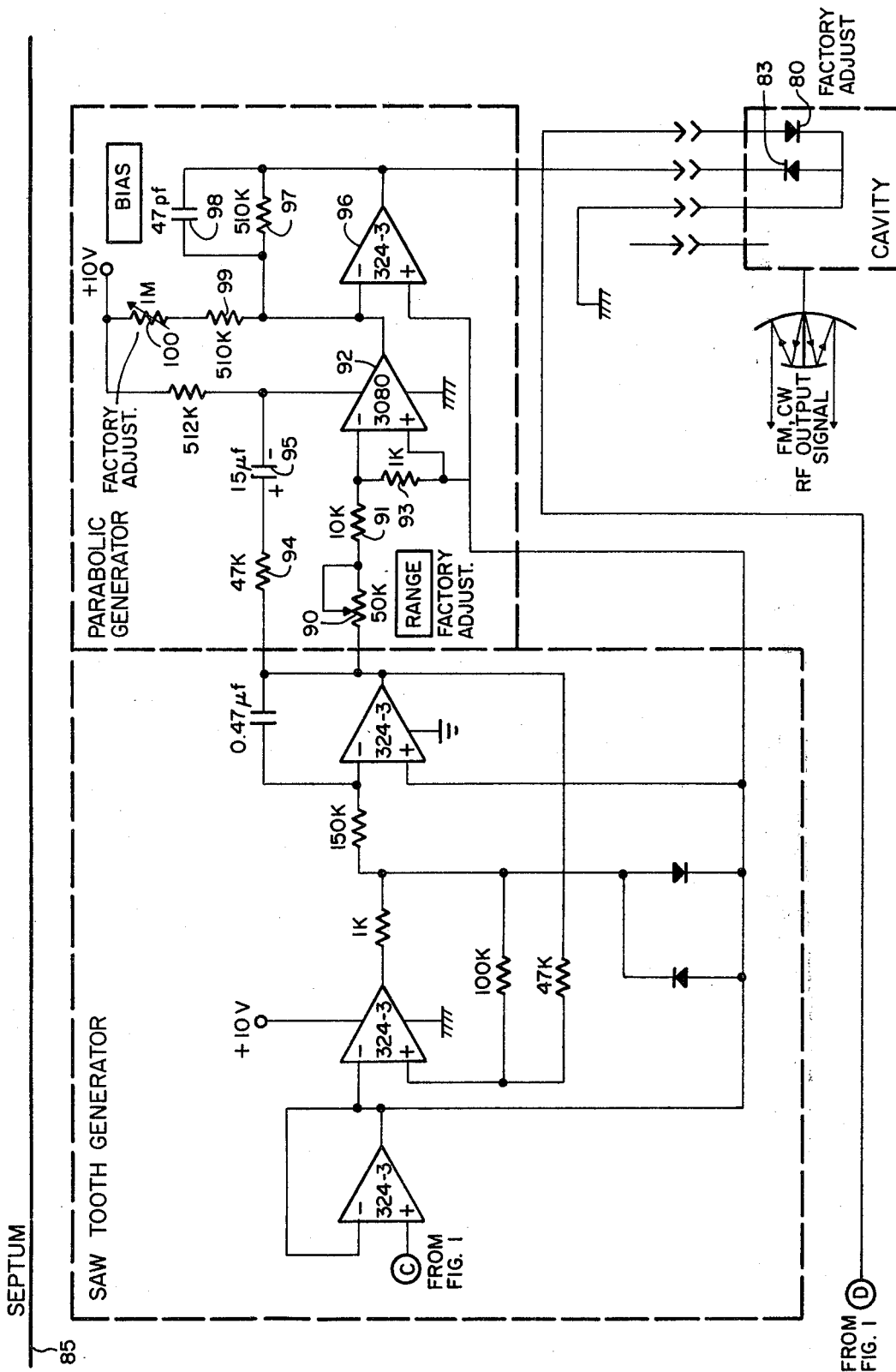
Figure 5:
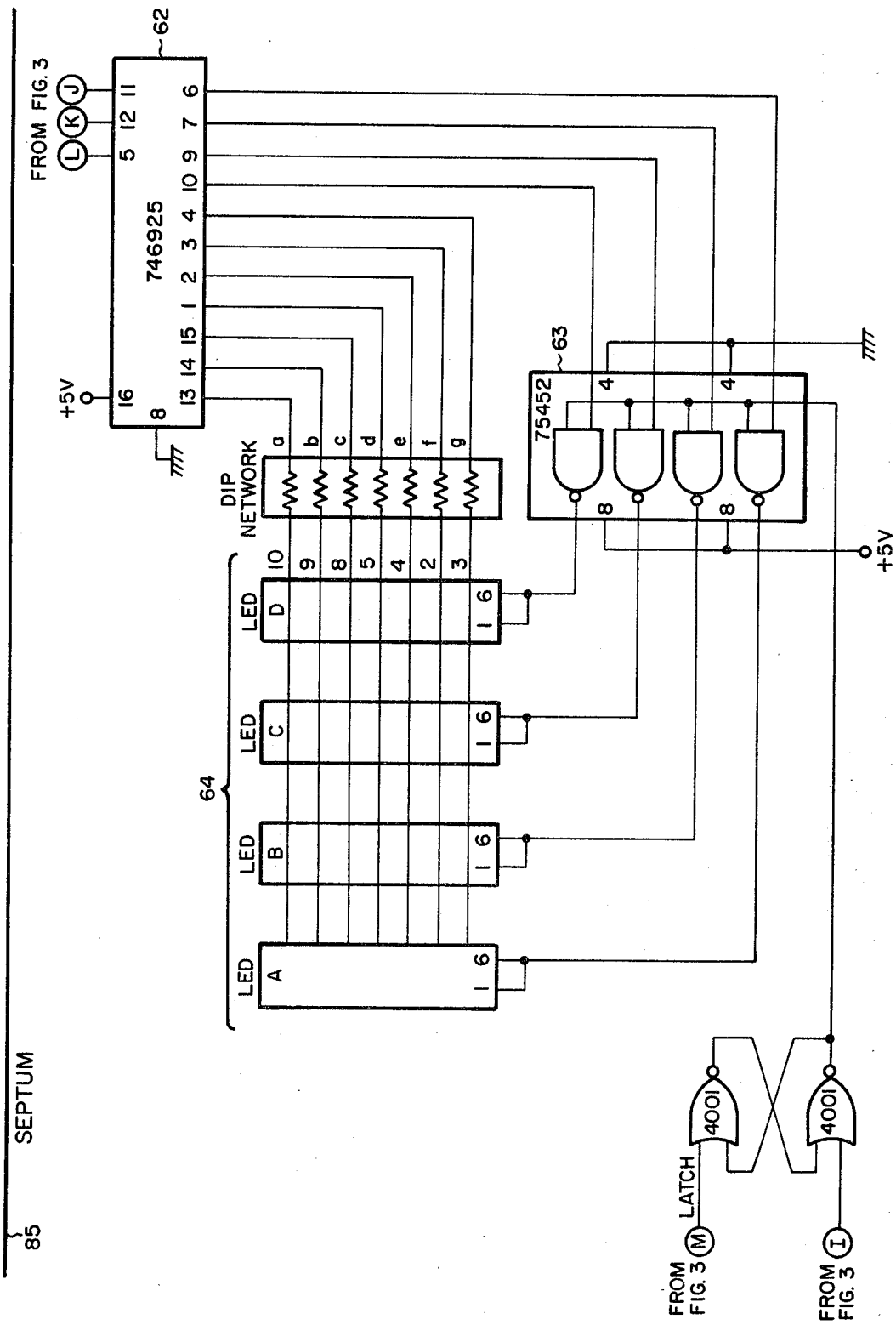

The Gunn diode rf oscillator 80 (FIG. 4) is driven from a power supply comprising an adjustable predriver 81 (FIG. 1) and a power transistor 82 (FIG. 1). This provides an output power from the Gunn diode of about 100 mW at a frequency of 14.025 GHz. When operated at its maximum range of about 2 miles, the above output power obtains a return signal of approximately 3 microvolts rms. depending on the target. Output and input signals are emitted and received from a common Cassegrain antenna system as shown.

FM modulation for the oscillator is provided as shown by a saw tooth generator network (FIG. 4) and parabolic shaping network (FIG. 4) which shapes the sweep signal to the varactor tuning diode 83 to provide a linearly swept FM, rf signal by means of inverse curvature. The saw tooth output is fed through an adjustable resistor 90 and fixed resistor 91 to OTA 92 and its voltage divider 93. A portion of the saw tooth signal is also coupled through an RC 94, 95 to the bias input of the OTA 92. The output signal from OTA 92 thus contains a component proportional to the square of the saw tooth output, and has the form: $AV^2+BV+C$, where A and B are constants that may be adjusted, and C is the offset; B, and C also can be zero. From OTA 92, the output current is fed to a current converter combination of operational amplifier 96 and feedback resistor 97; a capacitor 98 is employed to reduce the bandwidth, reject noise, etc. The combination of fixed resistor 99 and variable resistor 100 provides a dc. bias control for the varactor 83.

Power for the entire system including coupling and decoupling capacitors and an on-off switch, is supplied from conventional sources, not shown. To minimize interference, those portions of the device employing analogue power, i.e. the mixer, amplifier, filter, error drive, AGC, and signal counting are constructed on one side of a septum plate 85. The remaining components of the radar device including the saw tooth and parabolic generators, Gunn drive, audio, timer and LED circuits, all of which employ digital power, are constructed on the other side of the septum plate 85.

The radar device of this invention significantly improves the signal/noise ratio of a slowly moving signal using a unique tracking function and linearizing sweep for a tuned varactor which drives an inexpensive Gunn oscillator instead of a much more costly klystron device.

It will be appreciated that other integrated error drive functions similar to that described may be employed without departing from the spirit of this invention. These include integrated functions such as: $\text{High}_{p.v.}(\text{High}_{p.v.} - \text{Low}_{p.v.})$;

$$\frac{\text{High}_{p.v.}}{\text{High}_{p.v.} \pm \text{Low}_{p.v.}}; \frac{\text{Low}_{p.v.}}{\text{High}_{p.v.} \pm \text{Low}_{p.v.}};$$

and, $\text{Low}_{p.v.}(\text{High}_{p.v.} \pm \text{Low}_{p.v.})$, the negatives and inverses of the above, etc., and are included within the meaning of the preferred function $\text{High}_{p.v.}(\text{High}_{p.v.} + \text{Low}_{p.v.})$ which has been integrated. Likewise, bandpass, allpass and notch outputs can be employed in a similar fashion in place of the term: $(\text{High}_{p.v.} \pm \text{Low}_{p.v.})$.

Finally, it will be noted that the circuitry components of the present invention are quite inexpensive and, for the most part, are self adjusting during operation of the device. Only a few components require adjustment and they are made at the factory, where indicated. Power for the entire circuit including Gunn diode and LED display only requires a single 12 volt battery at 1.5 amps. The major portion of the power is consumed by the LED and the Gunn diode, about 1.2 amps, the balance being consumed by the remaining circuitry.

I claim:

1. A linearizing circuit for an oscillator including an rf cavity comprising:
   (a) means for providing a saw tooth sweep;
   (b) parabolic generating means for shaping the saw tooth sweep; and
   (c) a variable tuning diode in the rf cavity fed from the parabolic generator.

2. The linearizing circuit of claim 1 wherein output from the parabolic generator contains a component proportional to the square of the saw tooth output, with the form: $AV^2 + BV + C$, where A, B and C are adjustable constants and C is the offset.

3. In a linearizing circuit for an oscillator including an rf cavity, means for generating a non-linear predistortion factor to be applied to a signal supplied to a tuning means for said oscillator, said predistortion means, comprising:
   an operational amplifier receiving a signal from a linear sweep signal generating means; and
   passive means connected to said amplifier bias input for causing a signal at the output of said amplifier that is the square of the input signal thereto.

4. The non-linear predistortion generating means of claim 3, wherein the signal at the output of said amplifier has the form $AV^2 + BV + C$ wherein A and B are adjustable constants and C is the offset.

* * * * *